(12) United States Patent
Theel

(10) Patent No.: US 7,054,185 B2
(45) Date of Patent: May 30, 2006

(54) OPTIMIZED MRAM CURRENT SOURCES

(75) Inventor: Wayne Theel, Plymouth, MN (US)

(73) Assignee: Union Semiconductor Technology Corporation, Plymouth, MI (US)

( * ) Notice: Subject to any disclaimer, the term of this patent is extended or adjusted under 35 U.S.C. 154(b) by 135 days.

(21) Appl. No.: 10/724,983

(22) Filed: Nov. 30, 2003

(65) Prior Publication Data

US 2005/0117407 A1   Jun. 2, 2005

(51) Int. Cl.
 *G11C 8/00* (2006.01)
(52) U.S. Cl. .................. 365/158; 365/171; 365/173; 365/209; 365/225.5; 365/243.5
(58) Field of Classification Search ............... 365/158, 365/171, 173, 209, 225.5, 243.5
See application file for complete search history.

(56) References Cited

U.S. PATENT DOCUMENTS

| | | | |
|---|---|---|---|
| 5,946,227 A * | 8/1999 | Naji ....................... | 365/158 |
| 6,246,630 B1 | 6/2001 | Hosokawa et al. | |
| 6,341,084 B1 | 1/2002 | Numata et al. | |
| 6,385,111 B1 | 5/2002 | Tran et al. | |
| 6,407,946 B1 * | 6/2002 | Maruyama et al. ...... | 365/185.2 |
| 6,590,804 B1 | 7/2003 | Perner | |
| 6,674,679 B1 | 1/2004 | Perner et al. | |
| 6,683,815 B1 | 1/2004 | Chen et al. | |
| 6,700,814 B1 | 3/2004 | Nahas et al. | |
| 6,791,874 B1 | 9/2004 | Tran et al. | |
| 6,795,340 B1 | 9/2004 | Sakimura et al. | |
| 6,803,615 B1 * | 10/2004 | Sin et al. ..................... | 257/295 |
| 6,804,144 B1 | 10/2004 | Iwata | |
| 6,834,017 B1 | 12/2004 | Perner et al. | |
| 6,873,543 B1 | 3/2005 | Smith et al. | |
| 2004/0085122 A1 | 5/2004 | Perner et al. | |
| 2004/0228170 A1 * | 11/2004 | Brennan et al. ............ | 365/158 |
| 2005/0083748 A1 | 4/2005 | Lemus et al. | |

* cited by examiner

*Primary Examiner*—Richard Elms
*Assistant Examiner*—Pho M. Luu
(74) *Attorney, Agent, or Firm*—Jones Day

(57) ABSTRACT

A word current source (445) for a magnetoresistive random access memory circuit (420) includes an n-channel transistor (430) including a gate, a source and a drain, where the source is coupled to a supply ground, and the drain is coupled to the magnetoresistive random access memory circuit. A positive supply voltage is coupled to the magnetoresistive random access memory circuit (420) so as to allow current to flow through the magnetoresistive random access memory circuit (420) when an activation signal is applied to the gate by the control circuit.

14 Claims, 6 Drawing Sheets

OPTIMIZED MRAM CURRENT SOURCES

This application is related to co-pending Patent application Ser. Nos. 10/724,984, 10/724,985, 10/724,986 and 10/724,987, each of which was filed on Nov. 30, 2003.

FIELD OF THE INVENTION

The present invention relates to magnetoresistive random access memory (MRAM) devices, and, more particularly, to a word current source configuration and control for an MRAM device using an n-channel transistor.

BACKGROUND OF THE INVENTION

Typical MRAM structures have a nonmagnetic layer sandwiched between two ferromagnetic films. The two ferromagnetic films are also known as magnetic thin films. The MRAM employs the magneto resistive properties of this structure to store data. In each storage element, an MRAM employs two lines, commonly termed a word line and a sense string, in order to detect the magnetization direction of these magnetic thin films. Each string comprises a magnetic thin film that serves as a memory element, and the word line generally addresses multiple sense strings. Magnetic thin films that have a parallel moment have a low resistance and are typically assigned the '1' state. Magnetic thin films having an anti-parallel moment have a high resistance and are typically assigned the '0' state, but may also be assigned to the '1' state.

During a read operation, a word current passes through the word line causing the magnetic layers in the sense string to rotate, thereby changing the resistance in the sense string. A sense current passes through the sense string. A sense line receives the signal from the sense string. A differential amplifier compares the signal from the sense line to a reference line to determine whether a one resistance or a zero resistance is stored in the MRAM. A differential amplifier notes the change in voltage across the sense line to determine resistive state of a storage element.

In MRAM designs, word current sources are needed to provide large currents while operating with short turn on and turn off times. Since every memory element is associated with two such word current sources, the word current sources are replicated and present in many places throughout a typical MRAM. As a result, a sizable area of an MRAM chip is consumed by the numerous word current sources. Word current sources in complementary metal oxide semiconductor (CMOS) circuits are conventionally constructed using regulated p-channel transistors, where the regulated p-channel transistors are typically connected to a chip's positive voltage supply. The positive voltage supply is conventionally considered to be a current input.

Referring now to FIG. 4, there shown is a schematic circuit diagram of a magnetoresistive random access memory (MRAM) system 445 using a prior art word current source constructed using a conventional p-channel transistor device. The MRAM system 445 includes a positive voltage supply VDD, a supply ground GND, p-channel controlling circuitry 410, MRAM circuitry 420 supplied by the regulated current source and a p-channel transistor 430. The p-channel transistor 430 includes a gate Gp, a drain Dp and a source Sp. The gate Gp is connected to the output 412 of the p-channel controlling circuitry 410, the drain Dp is connected to a current input 422 of the MRAM circuitry 420. The source Sp is connected to the positive voltage supply VDD. When an activation signal is applied to gate Gp, current I flows into the MRAM circuitry 420 that then releases the current I' into the supply ground GND. In this case, the p-channel controlling circuitry 410 regulates the voltage level of p-channel control and limits the amount of current fed through it and the other components. The p-channel controlling circuitry 410 also regulates the current when the p-channel and hence the source itself is turned on and off.

Control while switching the p-channel transistor 430 on and off is also important because the p-channel transistor 430 is turned on and off rapidly. Rapid cycling between on and off conditions could lead to a brief period where the current exceeds the desired level. This is a condition known as switching overshoot. In the MRAM, currents exceeding the desired level for only a brief time could cause faulty operation. Thus, word current sources must be closely controlled so that there is very little switching overshoot.

There is therefore a need in the art for a new word current source with a smaller transistor size that maintains a more stable control.

SUMMARY OF THE INVENTION

The present invention provides a word current source for a magnetoresistive random access memory circuit. The word current source includes a regulated n-channel transistor including a gate, a source and a drain, where the source is coupled to a supply ground, and the drain is coupled to the magnetoresistive random access memory circuit. A positive supply voltage is coupled to the magnetoresistive random access memory circuit so as to allow current to flow through the magnetoresistive random access memory circuit when an activation signal is applied to the gate by the control circuit.

In other aspects of the present invention, the control circuit comprises a voltage regulator that regulates a voltage level at the gate, so as to limit an amount of current flowing through the n-channel transistor and the magnetoresistive random access memory circuit, and with the voltage regulator comprising a feed back amplifier.

In other aspects of the present invention, the voltage regulator is current controlled.

In other aspects of the present invention, the n-channel transistor comprises a complementary metal oxide semiconductor n-channel field effect transistor.

In other aspects of the present invention, the control circuit comprises a current regulator that regulates current flowing through the complementary metal oxide semiconductor (CMOS) n-channel field effect transistor when the CMOS n-channel field effect transistor is turned on and off.

In other aspects of the present invention, the current regulator comprises a feed-back amplifier.

In other aspects of the present invention, the control circuit comprises a stabilization amplifier.

In other aspects of the present invention, the stabilization amplifier further comprises a logic control having a read/write input and an on/off input and a write reference gate control signal and a read reference gate control signal; a read reference switch having a read reference input and a reference output, with the read reference switch having a read reference control connected to the read reference gate control signal; a write reference switch having a write reference input and a write reference output connected to the reference output, with the write reference switch having a write reference control connected to the write reference gate control signal; and a feedback amplifier connected to the reference output, having a mirror current output and a mirror feedback voltage input.

In other aspects of the present invention, the control input is a regulated mirror gate signal.

In other aspects of the present invention, a word current source for a magnetoresistive random access memory circuit comprises a control circuit having a regulated mirror gate signal; a complementary metal oxide semiconductor (CMOS) n-channel transistor including a gate, a source and a drain, where the source is coupled to a supply ground, and the drain is coupled to the magnetoresistive random access memory circuit; and a positive supply voltage coupled to the magnetoresistive random access memory circuit so as to allow current to flow through the magnetoresistive random access memory circuit when an activation signal is applied to the gate by the control circuit, wherein the control circuit comprises means for regulating the voltage level at the gate so as to limit the amount of current flowing through the CMOS n-channel transistor and the magnetoresistive random access memory circuit.

In other aspects of the present invention, the control circuit comprises means for regulating a current flowing through the CMOS n-channel transistor when the CMOS n-channel transistor is turned on and off.

In other aspects of the present invention, the control circuit further comprises a stabilization amplifier.

In other aspects of the present invention, the stabilization amplifier further comprises a logic control having a read/write input and an on/off input and a write reference gate control signal and a read reference gate control signal; a read reference switch having a read reference input and a reference output, with the read reference switch having a read reference control connected to the read reference gate control signal; a write reference switch having a write reference input and a write reference output connected to the reference output, with the write reference switch having a write reference control connected to the write reference gate control signal; and a feedback amplifier connected to the reference output having a mirror current output and a mirror feedback voltage input.

In other aspects of the present invention, a magnetoresistive random access memory circuit comprises a control circuit having a control input; an n-channel semiconductor device including a first terminal, a second terminal and a third terminal, where the first terminal is coupled to a supply ground, and the second terminal is coupled to the magnetoresistive random access memory circuit; and a positive supply voltage, coupled to the magnetoresistive random access memory circuit so as to allow current to flow through the magnetoresistive random access memory circuit when an activation signal is applied to the third terminal by the control circuit.

In other aspects of the present invention, the control circuit comprises means for regulating the voltage level at the third terminal, so as to limit the amount of current flowing through the n-channel semiconductor device and the magnetoresistive random access memory circuit.

DESCRIPTION OF THE PREFERRED EMBODIMENT

Figure 1:
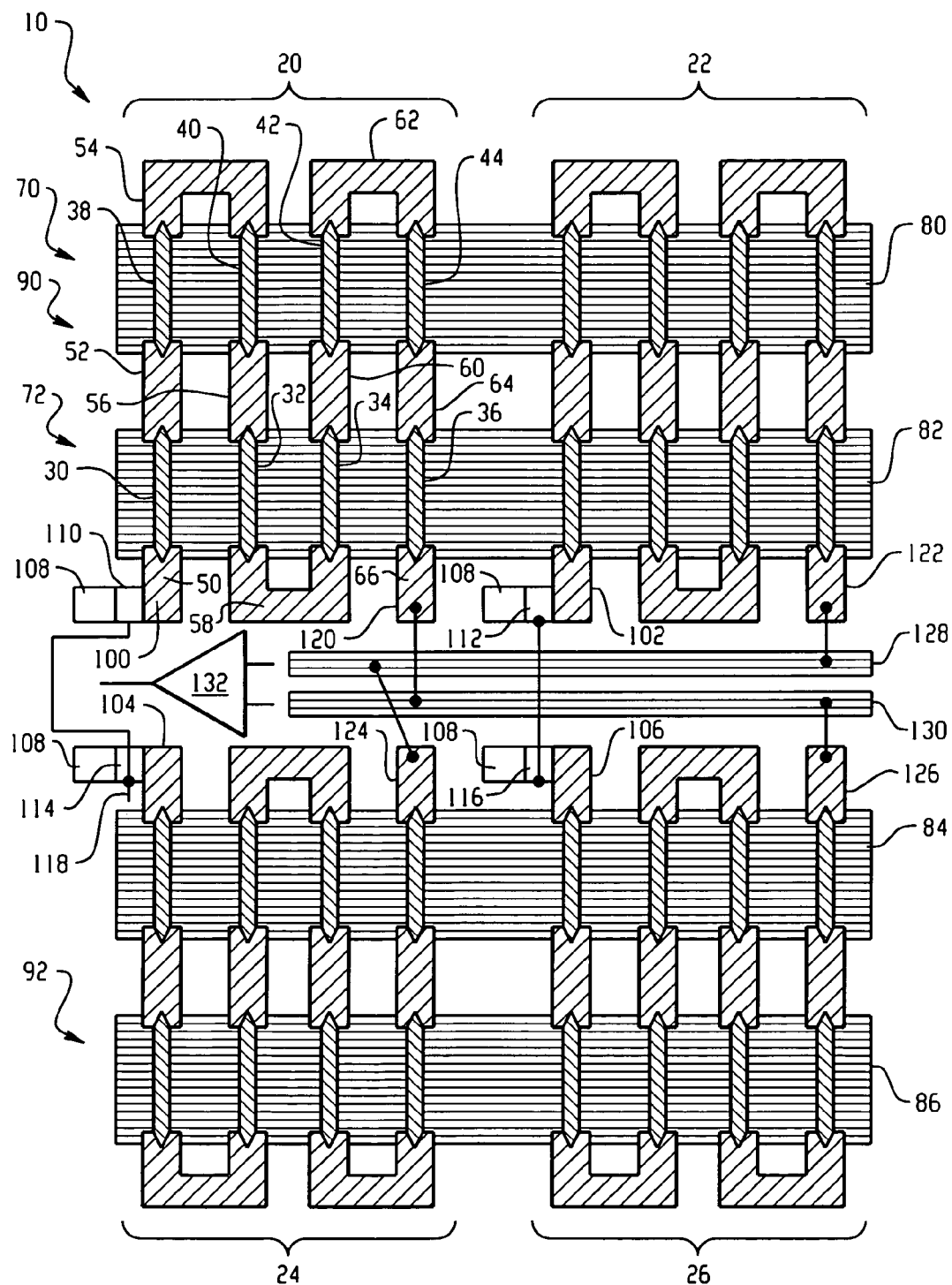
FIG. 1 shows a top view of an MRAM segment utilizing preferred methods according to the preferred teachings of the present invention, with portions of the MRAM structure removed to show details of the noise stabilization and reduction apparatus of the present invention.

A top view of an MRAM segment having an optimized MRAM current source, according to the preferred teachings of the present invention, is shown in FIG. 1 and is generally designated 10. Portions of the MRAM structure shown in FIG. 1 have been removed to show details more clearly. Those skilled in the art will be aware that MRAM chips contain other structures and layers, such as a transistor layer that may be formed from polysilicon and a metal connect layer. These elements have been removed for the sake of clarity.

The MRAM segment includes a plurality of sense strings 20, 22, 24, 26. Each sense string 20, 22, 24, 26 includes one or more sub bits 30, 32, 34, 36, 38, 40, 42, 44 connected by strap layer segments 50, 52, 54, 56, 58, 60, 62, 64, 66. In the preferred embodiment of the present invention, the strap layer segments 50, 52, 54, 56, 58, 60, 62, 64, 66 connect the sub bits 30, 32, 34, 36, 38, 40, 42, 44 in series. In further aspects of the preferred embodiment, the structure of the sense strings 20, 22, 24, 26 have a serpentine conformation. In this conformation, groups of two sub bits 30, 32, 34, 36, 38, 40, 42, 44 form linear components. The strap layer segments 50, 52, 54, 56, 58, 60, 62, 64, 66 provide connection elements to join the sub bits 30, 32, 34, 36, 38, 40, 42, 44 into these linear components. Four of these linear components are located parallel to one another. The strap layer segments 50, 52, 54, 56, 58, 60, 62, 64, 66 also provide connection elements to join the linear components at alternating ends in order to connect the sub bits 30, 32, 34, 36, 38, 40, 42, 44 in series. In the preferred embodiment, the sense strings 20, 22, 24, 26 include eight sub bits 30, 32, 34, 36, 38, 40, 42, 44 connected in series. In an alternative embodiment, the sense strings 20, 22, 24, 26 may make up a single sub bit. Different numbers of sub bits and as well as different arrangements of the sub bits may be employed without departing from the spirit and scope of the invention.

The sub bits 30, 32, 34, 36, 38, 40, 42, 44 include the data storage element of the MRAM segment 10. These sub bits 30, 32, 34, 36, 38, 40, 42, 44 may also be termed "memory spots" or "memory elements". In the preferred embodiment, the sub bits or memory spots 30, 32, 34, 36, 38, 40, 42, 44 are grouped in fours, where the upper four memory spots 38,

40, 42, 44 make up an upper bit 70 and the lower four memory spots 30, 32, 34, 36 make up a lower bit 72.

The MRAM segment 10 employs a word line 80, 82, 84, 86 to address a selected bit 70, 72. In the preferred embodiment, the MRAM segment 10 uses two word lines 80, 82 to address the sense strings 20, 22, 24, 26, with an upper word line 80 addressing the memory spots 38, 40, 42, 44 of the upper bit 70 and a lower word line 82 addressing the memory spots 30, 32, 34, 36 of the lower bit 72. The upper word line 80 intersects each of the upper sub bits 38, 40, 42, 44 so that a sense current passing through the upper sub bits 38, 40, 42, 44 is orthogonal to a word current passing through the upper word line 80. Likewise, the lower word line 82 intersects each of the lower sub bits 30, 32, 34, 36 so that a sense current passing through the lower sub bits 30, 32, 34, 36 is orthogonal to a word current passing through the lower word line 82. Serial connection of the memory spots 30, 32, 34, 36, 38, 40, 42, 44 combined with activation of the word line 80, 82, 84, 86 corresponding to a selected bit 70, 72 allows each sub bit 30, 32, 34, 36, 38, 40, 42, 44 of the selected bit 70, 72 to contribute proportionally to the signal size.

As those skilled in the art will understand, other conformations of the sense strings 20, 22, 24, 26 may be employed without departing from the spirit or scope of the invention. In the four memory spot bit described above, each memory spot, or sub bit 30, 32, 34, 36, 38, 40, 42, 44 is designed to have length to width ratio providing for consistent switching characteristics. In one aspect of the invention, the number of memory spots 30, 32, 34, 36, 38, 40, 42, 44 per bit 70, 72 is designed to provide a selected signal size. In another aspect of the present invention, the number of memory spots 30, 32, 34, 36, 38, 40, 42, 44 per bit 70, 72 is designed to provide redundancy in the event of a defective bit. The defective bit may be the result of a manufacturing defect or operational failure. The MRAM may be advantageously designed to have functional bits with only three of four memory spots operational. In another embodiment, the MRAM may be advantageously designed to have functional bits with only two of three memory spots operational.

In other aspects of the present invention, the multiple memory spots 30, 32, 34, 36, 38, 40, 42, 44 of the bit 70, 72 may be addressed by a single word line 80, 82, 84, 86 to conserve power and allow a higher density of bits 70, 72; or alternatively, multiple word lines 80, 82, 84, 86 may be used to address the multiple memory spots 30, 32, 34, 36, 38, 40, 42, 44 of the bit 70, 72 when more memory spots 30, 32, 34, 36, 38, 40, 42, 44 are desired to obtain a stronger signal to noise ratio or a higher level of redundancy.

In a typical MRAM structure, an array 90 of sense strings includes multiple sense strings 20, 22 positioned adjacent to one another in a linear arrangement. These sense strings 20, 22 have the same general shape, so that the word line 80, 82 may address the sub bits 30, 32, 34, 36, 38, 40, 42, 44 of each sense string in the array 90. In one preferred embodiment, the array 90 includes thirty-three sense strings 20, 22 that may each be addressed by the upper word line 80 and the lower word line 82. As those skilled in the art will understand, the word line 80, 82 may address more or fewer sense strings 20, 22 without departing from the spirit or scope of the present invention. The sub bits 30, 32, 34, 36, 38, 40, 42, 44 of each sense string 20, 22 must be positioned so that a sense current passing through the sub bits 30, 32, 34, 36, 38, 40, 42, 44 is orthogonal to a word current passing through the word line 80, 82.

Each sense string 20, 24 has an input end 100, 102, 104, 106 connected to a voltage source 108 through a switch 110, 112, 114, 116. A transistor may serve as the switch 110, 112, 114, 116. A signal 118 triggers the switch 110, 112, 114, 116 of a selected sense string 20, 22, 24, 26 to allow a sense current to pass through the respective sense string 20, 22, 24, 26. Each sense string 20, 22, 24, 26 also has an output end 120, 122, 124, 126 connected to a sense line 128, 130. In the preferred form, the MRAM segment 10 includes two sense lines, an upper sense line 128 and a lower sense line 130, respectively. The MRAM segment 10 further includes two arrays 90, 92 of sense strings 20, 22, 24, 26, an upper array 90 positioned above the two sense lines 128, 130 and a lower array 92 positioned below the two sense lines 128, 130.

The MRAM segment 10 of the preferred form of the present invention provides for noise stabilization and reduction through the coupling of the respective output ends 120, 122, 124, 126 of the sense strings of the upper array 90 and the lower array 92. In one example embodiment, shown in FIG. 1, the output end 120, 122 of each of the sense strings 20, 22 of the upper array 90 is connected alternately to the upper sense line 128 and the lower sense line 130. Thus, in this example embodiment, sense string 20 is connected to the lower sense line 130, and sense string 22 is connected to the upper sense line 128. Likewise, the output end 120, 122, 124, 126 of each of the sense strings 24, 26 in the lower array 92 is connected alternately to the upper sense line 128 and the lower sense line 130. In this example embodiment, sense string 24 is connected to the upper sense line 128 and sense string 26 is connected to the lower sense line 130. This pattern of coupling the output ends 120, 122, 124, 126 of the sense strings 20, 22, 24, 26 continues for each of the sense strings 20, 22, 24, 26 in the arrays 90, 92. Those skilled in the art will understand that other patterns of coupling the output ends 120, 122, 124, 126 of the sense strings 20, 22, 24, 26 may be employed without departing from the spirit or scope of the present invention.

The upper sense line 128 and the lower sense line 130 provide the signal from the sense strings 20, 22, 24, 26 to a differential amplifier 132. The differential amplifier 132 detects the voltage difference in the signal provided by the upper sense line 128 and the lower sense line 130. Determination of the state of a selected bit makes use of the output of the differential amplifier 132.

Figure 2A:
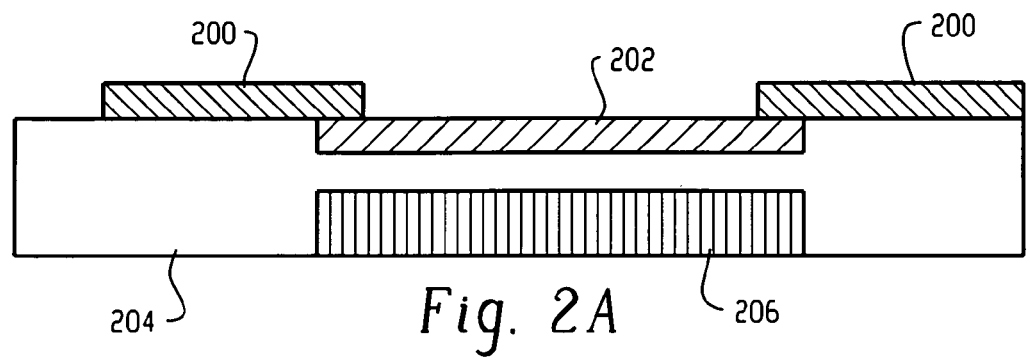
FIG. 2A shows an end view of a sense string and word line, with portions of the MRAM structure removed to show details of the structure of the sense string and word line.
Figure 2B:
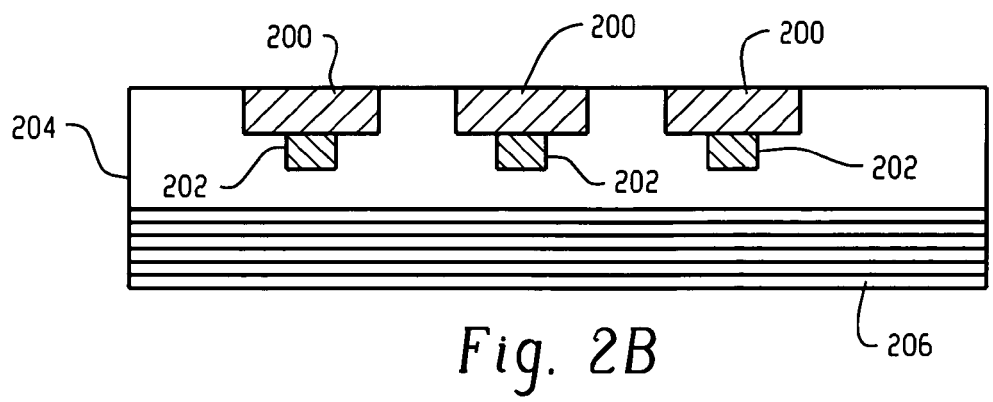
FIG. 2B shows a side view of a sense string and word line, with portions of the MRAM structure removed to show details of the structure of the sense string and word line.

FIGS. 2A and 2B show an end view and a side view, respectively, of a sense string 20, 22, 24, 26 and word line 80, 82, with portions of the MRAM structure removed to show details of the structure of sense string 20, 22, 24, 26 and word line 80, 82. The MRAM segment 10 has a strap layer 200 and a bit layer 202 embedded within a dielectric layer 204. The dielectric layer 204 also serves as an insulating layer 204. The sub bits 30, 32, 34, 36, 38, 40, 42, 44 are formed from sections of the bit layer 202 embedded within the dielectric layer 204. As shown in FIGS. 2A and 2B, the strap layer 200 overlies the bit layer 202. The strap layer 200 provides connection elements between the sub bits 30, 32, 34, 36, 38, 40, 42, 44. Overlap between the strap layer 200 and the sub bits 30, 32, 34, 36, 38, 40, 42, 44 provide contact between the strap layer 200 and the sub bits 30, 32, 34, 36, 38, 40, 42, 44. The word lines 206 are also embedded within the dielectric layer 204, and in the preferred form, the sense strings 20, 22, 24, 26 overlie the word lines 206. The conformation of the word lines 206 and the sense strings 20, 22, 24, 26 become a source of capacitive coupling. Furthermore, in order to present a substantially uniform field to the sub bits 30, 32, 34, 36, 38, 40, 42, 44, the length of the sub bits may be limited to the width of the word lines 206.

The present invention provides for a greater signal differential by employing multiple sub bits 30, 32, 34, 36, 38, 40, 42, 44 for each bit 70, 72. The memory spots for each bit are set to have the same magnetization state. Thus, in a high resistance state, or "0" state, the difference in resistance from a low resistance state, or "1" state, will be proportional to the number of memory spots 30, 32, 34, 36, 38, 40, 42, 44 in a bit 70, 72. In the preferred embodiment, sub bits 30, 32, 34, 36 and sub bits 38, 40, 42, 44 each make up one bit 70, 72, respectively. By connecting these memory spots 30, 32, 34, 36, 38, 40, 42, 44 in series, the example embodiment shown provides a signal having a voltage drop four times the magnitude that would be provided from a single memory spot. More or fewer memory spots or sub bits 30, 32, 34, 36, 38, 40, 42, 44 may be employed for each bit 70, 72 to provide a signal having a desired magnitude.

The present invention also provides for a greater memory capacity by employing multiple groups of sub bits 30, 32, 34, 36, 38, 40, 42, 44 on each sense string 20, 22, 24, 26. Each group of sub bits 30, 32, 34, 36, 38, 40, 42, 44 on the sense string 20, 22, 24, 26 make up a separate bit 70, 72 and has a separate word line 80, 82, 84, 86 so that each group of sub bits 30, 32, 34, 36, 38, 40, 42, 44 may be addressed separately. In the preferred embodiment of the present invention, the upper word line 80 addresses upper sub bits 38, 40, 42, 44 and the lower word line 82 addresses lower sub bits 30, 32, 34, 36. A word current through either word line 80, 82 addresses the respective sub bits while not appreciably changing the resistance of the other sub bits. More or fewer groups of sub bits may be employed without departing from the scope of the present invention.

The MRAM queries the state of a bit using a sense current and a word current. By way of example, and not limitation, determination of the lower bit 72 begins by sending a signal that triggers the switches 110, 114 for the first sense string 20 and the reference sense string 24. This allows a sense current from voltage source 108 to flow through each respective sense string 20, 24. Concurrently, the MRAM applies a word current through the lower word line 82 of the upper array 90. All other sense strings 22, 26 and word lines 80, 84, 86 remain inactive. The magnetic field from the word current change the resistance of the sub bits 30, 32, 34, 36 to the sense current. By way of example, the current through the sense strings 20, 24 can be on the order of 3–5 milliamps and the current passing through the word line 82 can be on the order of 40–50 milliamps. These values are representative and may vary.

In the foregoing example, the lower sense line 130 receives the sense current from the sense string 20 and serves as a reference sense line. A second sense string, reference sense string 24, acts as a reference for sense string 20 and provides a reference signal unaffected by a word current. An upper sense line 128 receives the sense current through sense string 24. In a similar fashion, when the MRAM segment 10 addresses a bit on sense string 24, sense string 20 may serve as a reference. The differential amplifier 132 samples the signals from the upper sense line 128 and the lower sense line 130. The differential amp 132 includes circuitry to employ an auto zero technique that locks in the difference of the signals from the upper sense line 128 and the lower sense line 130 as a base value. The current on the word line 82 is then reversed, causing the resistance of the memory spots 30, 32, 34, 36 to change because of the change of the magnetic field generated by the word line 82. The differential amplifier 132 then samples the signals from the upper sense line 128 and the lower sense line 130 again and provides the results to a comparator. The differential amplifier 132 further includes a comparator to determine the state of the lower bit 72.

In the foregoing example, the differential amplifier 132 receives a signal from the sense string 20 on the lower sense line 130 and a signal from reference sense string 24 on upper sense line 128. However, in addition to the signal from the sense current passing through the sense string 20, the current from the word line 82 has a capacitive interconnect with the sense string 20 and each of the sense strings 22 in the same array as the sense string 20. The capacitive interconnects generate a significant amount of noise in comparison to a bit component of the signal from the sense string, comprising up to fifty percent of the bit component. Furthermore, the noise generated by the capacitive interconnects between the word line 82 and the sense strings 20, 22, 24, 26 vary between each sensing event. Also, the noise is proportional to the number of sense strings 20, 22 in the array 90. Thus, as the array size increases, the amount of noise due to capacitive interconnects increases proportionally. These noise levels are a major impediment to development of fast and reliable MRAM applications. With increasing MRAM array sizes, these hindrances are exacerbated.

The MRAM segment 10 according to the preferred teachings of the present invention stabilizes and reduces noise generated by these capacitive interconnects. By coupling a first portion of each array 90 of sense strings to the upper sense line 128 and a second portion of each array 90 of sense strings 20, 22, 24, 26 to the lower sense line 130, the MRAM segment 10 reduces the amount of noise seen by each sense line 128, 130 proportional to the portion of sense strings 20, 22, 24, 26 coupled to the other sense line 128, 130. In the preferred embodiment, alternating sense strings 20, 22, 24, 26 in an array 90, 92 are coupled the upper sense line 128 and the lower sense line 130, respectively, reducing the amount of noise from capacitive coupling by approximately fifty percent. MRAM segment 10 according to the preferred teachings of the present invention also stabilizes the effect of noise through cross coupling of the sense strings 20, 22, 24, 26. The cross coupling of the sense strings 20, 22, 24, 26 balances the noise generated in the sense strings 20, 22, 24, 26 by activation of the word line 80, 82 between the upper sense line 128 and the lower sense line 130.

Figure 3:
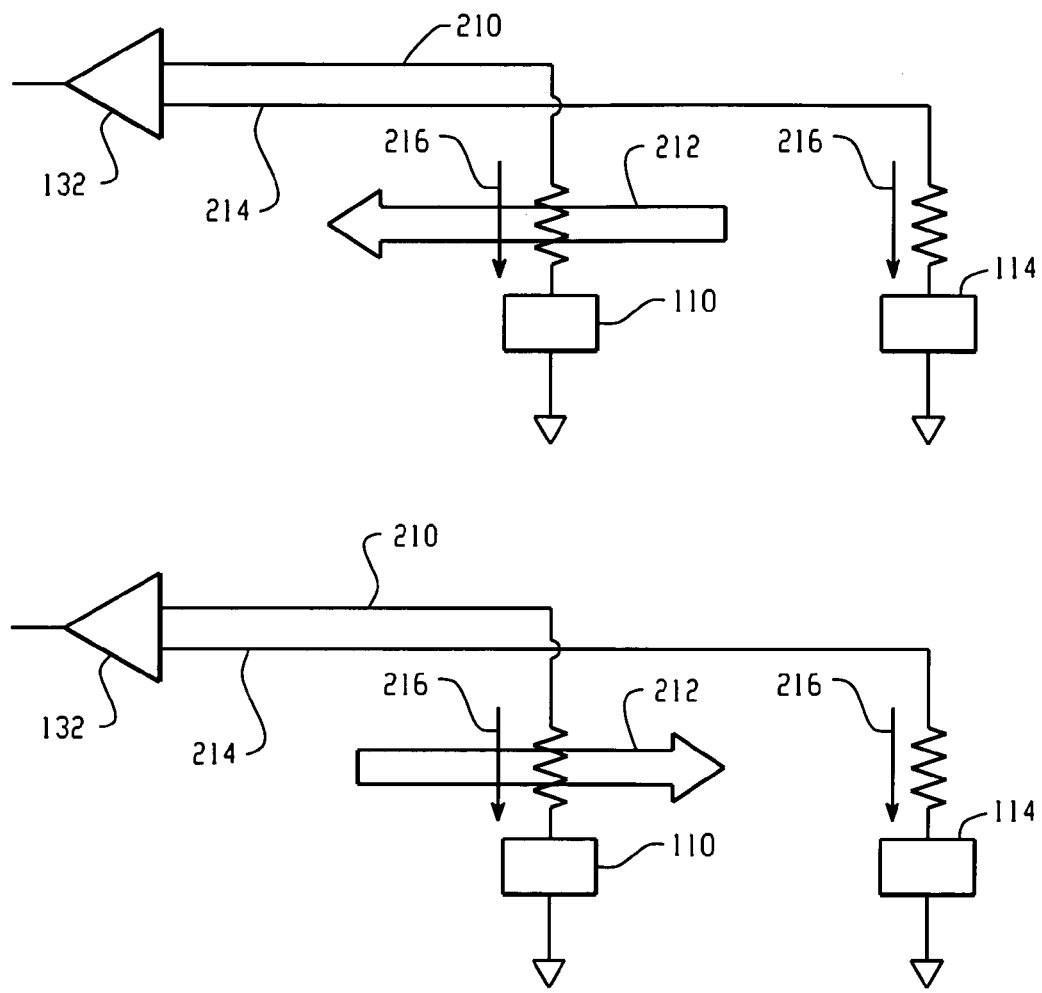
FIG. 3 shows a simplified circuit seen by the differential amplifier utilizing preferred methods according to the preferred teachings of the present invention with a sense string and a word line active.
Figure 4:
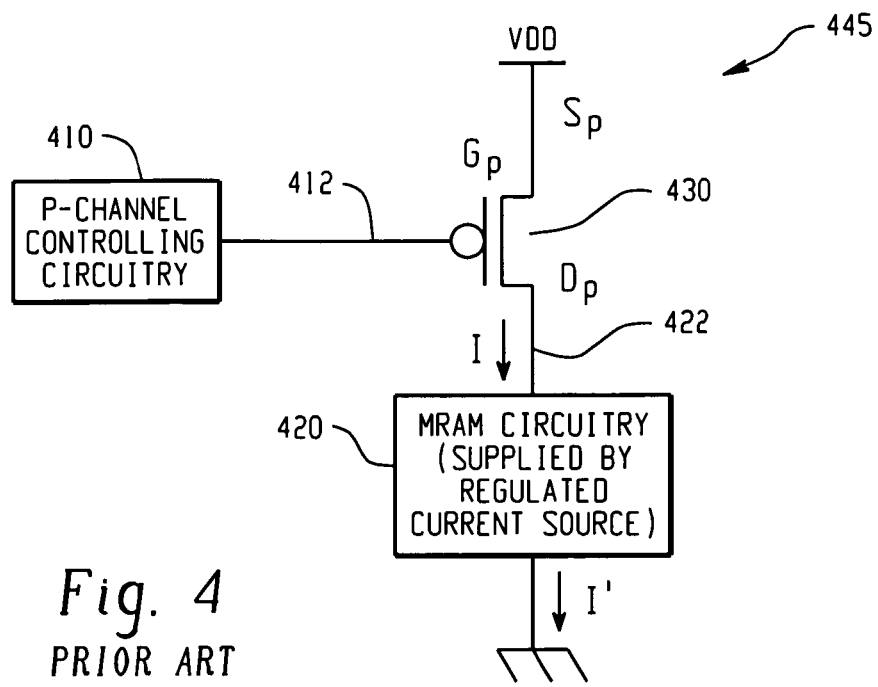
FIG. 4 shows a schematic circuit diagram of a prior art word current source for use in a magnetoresistive random access memory (MRAM) using a conventional p-channel device.

FIG. 3 shows a simplified circuit seen by differential amplifier 132 with the sense string 20 and the word line 82 active. At one input, the differential amplifier 132 receives the sense signal 210 from a sense string 20 having an active word line 82 with a word current 212. The other input receives a reference signal 214 from the reference sense string 24. Both the sense signal 210 and the reference signal 214 include a sense current 216 and a noise current injected by the capacitive coupling. The difference seen by the differential amplifier 132 is now largely due to the different voltage drop across the sense string 20 with the active word line 82 because of the different resistance to the sense current 216. A second signal can be obtained by reversing the word current 212.

The sense current 216 through switch 110 and switch 114 can be developed with two identical drive transistors.

Figure 5:
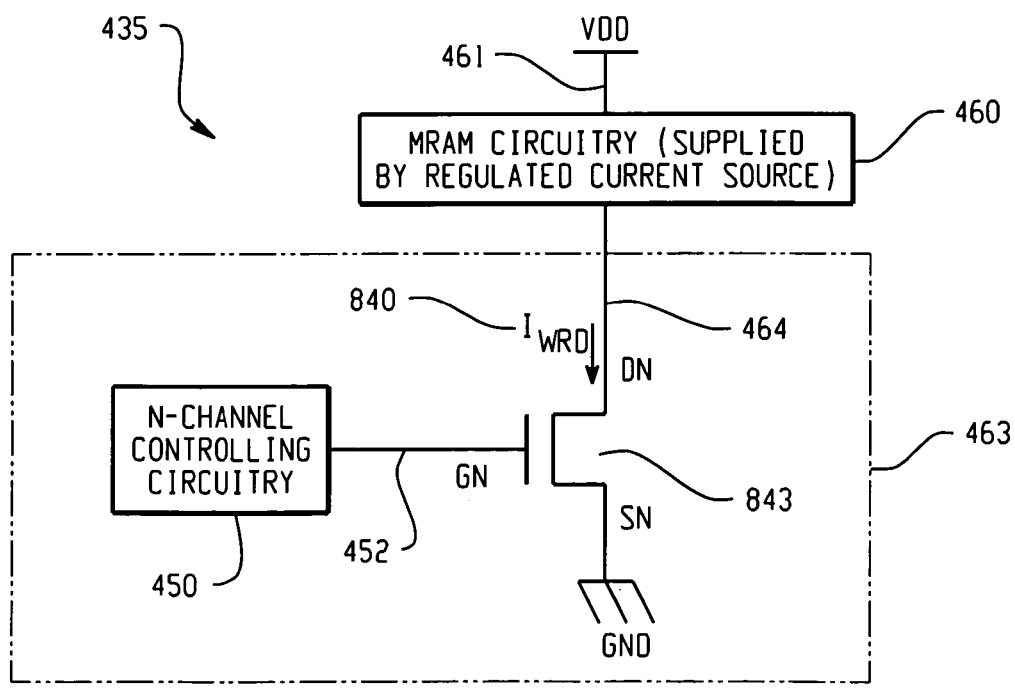
FIG. 5 shows a schematic circuit diagram of a word current source for use in an MRAM using an n-channel device constructed in accordance with the preferred teachings of the present invention.

Referring now also to FIG. 5, there shown is a schematic circuit diagram of a MRAM with an optimized MRAM current source system 435 using a word current source 463 constructed using a regulated n-channel transistor 843 as contemplated by the present invention. The optimized current source system 435 includes a positive voltage supply VDD, a supply ground GND, n-channel controlling circuitry 450, MRAM circuitry 460 supplied by the regulated current source 463 and the n-channel transistor 843. The positive voltage supply VDD is connected to a current input 461 of the MRAM circuitry 460. The n-channel transistor 843 includes a gate Gn, a drain Dn and a source Sn. The gate Gn is connected to the output 452 of the n-channel controlling circuitry 450, the drain Dn is connected to a current output 462 of the MRAM circuitry 460. The source Sn is connected to the supply ground GND. When an activation signal is applied to gate Gn, current Iwrd flows through the MRAM circuitry 460 from VDD and through the n-channel transistor 843 into the supply ground GND. In this case the n-channel controlling circuitry 450 regulates the voltage level of n-channel control and limits the amount of current fed through it and the other components. The n-channel controlling circuitry 450 also regulates the current when the n-channel transistor 843 and hence the regulating current source 463 itself is turned on and off. The stabilization amplifier 500 shown in FIG. 6 may be used to accomplish this function.

Provisions are suitably provided to use word current sources constructed using regulated n-channel transistors. N-channel transistors conduct more current per unit size and can be more precisely controlled. Thus, the drive transistor size, such as transistor 843, can be reduced by approximately ½ as compared to p-channel transistor devices, while maintaining tight control of the current word source 463. Word current sources 463 thus constructed in accordance with the invention are proportionally reduced in size, resulting in a substantial reduction in size for an MRAM chip 10 employing the word current sources 463 as contemplated by the present invention.

For the purpose of explaining the invention, it will be described herein with reference to example embodiments. It will be understood that the example embodiments are by way of illustrating the various aspects of the invention and that the invention is not limited by the examples. As contemplated by the present invention, the concept of using a regulated n-channel word current source design, as opposed to the old regulated p-channel current source based designs, is based on the word current source being a circuit used to control the amount of current allowed to flow between positive voltage supply VDD and supply ground GND. While the word current source 463 is required to be stable independent of variables such as supply voltage, process variation and temperature, it doesn't matter where it is in the connection between voltage supply VDD and supply ground GND as long as the function is performed. Connecting the word current source 463 to supply ground GND is, therefore, a result of redefining the function of a word current source.

One feature of a word current source constructed in accordance with the present invention using a regulated n-channel based source transistor 843, is that the associated n-channel controlling circuitry 450 can also advantageously be smaller and consume less area on an MRAM 10 as compared to previous designs. This is true because the current source controlling circuitry 450 may be sized in proportion to the device being driven. Since an n-channel device is about half the size of a p-channel device the n-channel controlling circuitry 450 can also be about half the size of a prior art p-channel current source control.

According to the preferred teachings of the present invention, smaller n-channel devices have less capacitance and can be turned on in less time, with greater control. This in turn leads to lower noise during operation, thereby increasing the reliability of an MRAM 10 constructed in accordance with the present invention.

Figure 6:
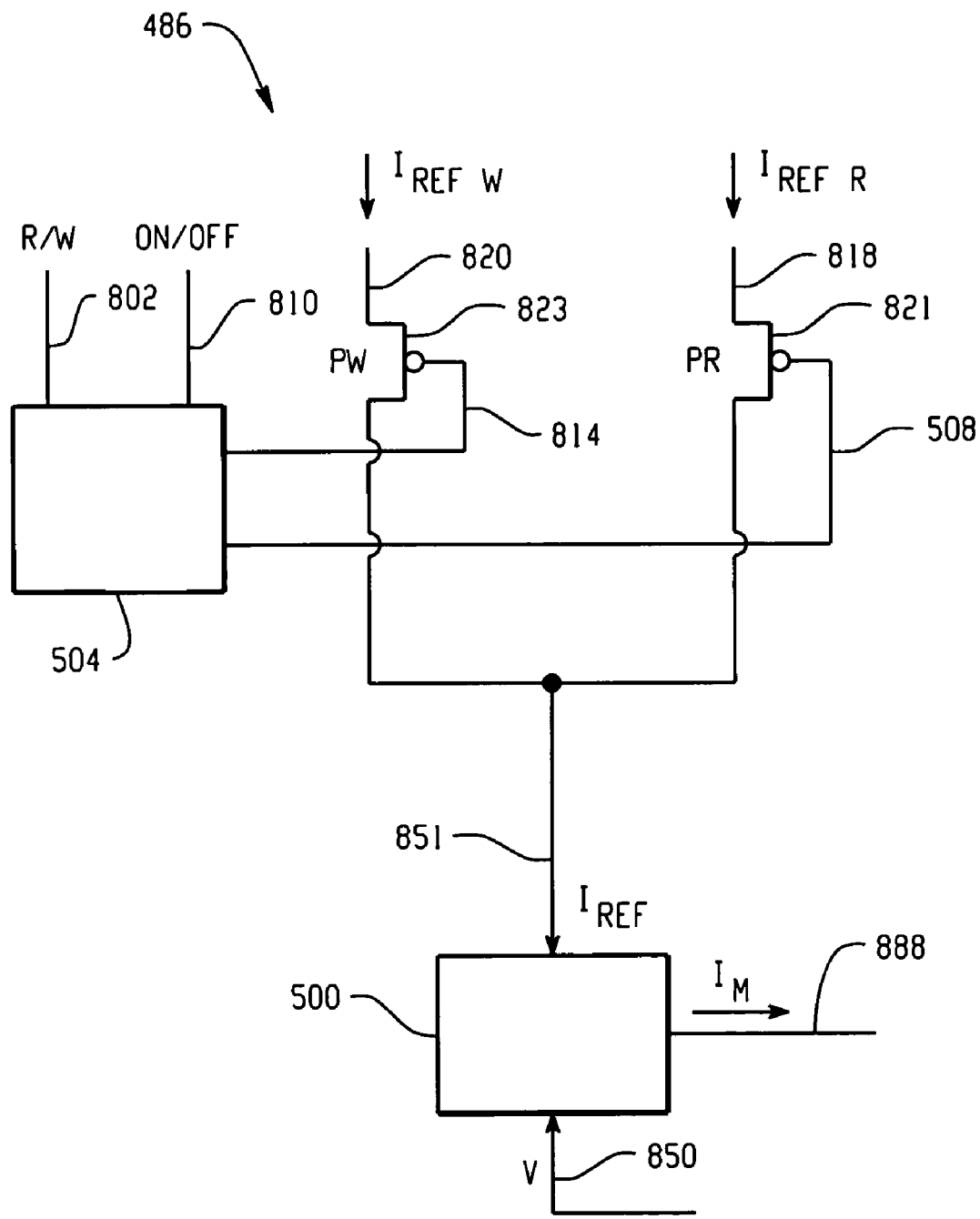
FIG. 6 shows a circuit schematic diagram of a feedback based current driver according to the preferred teachings of the present invention.
Figure 7:
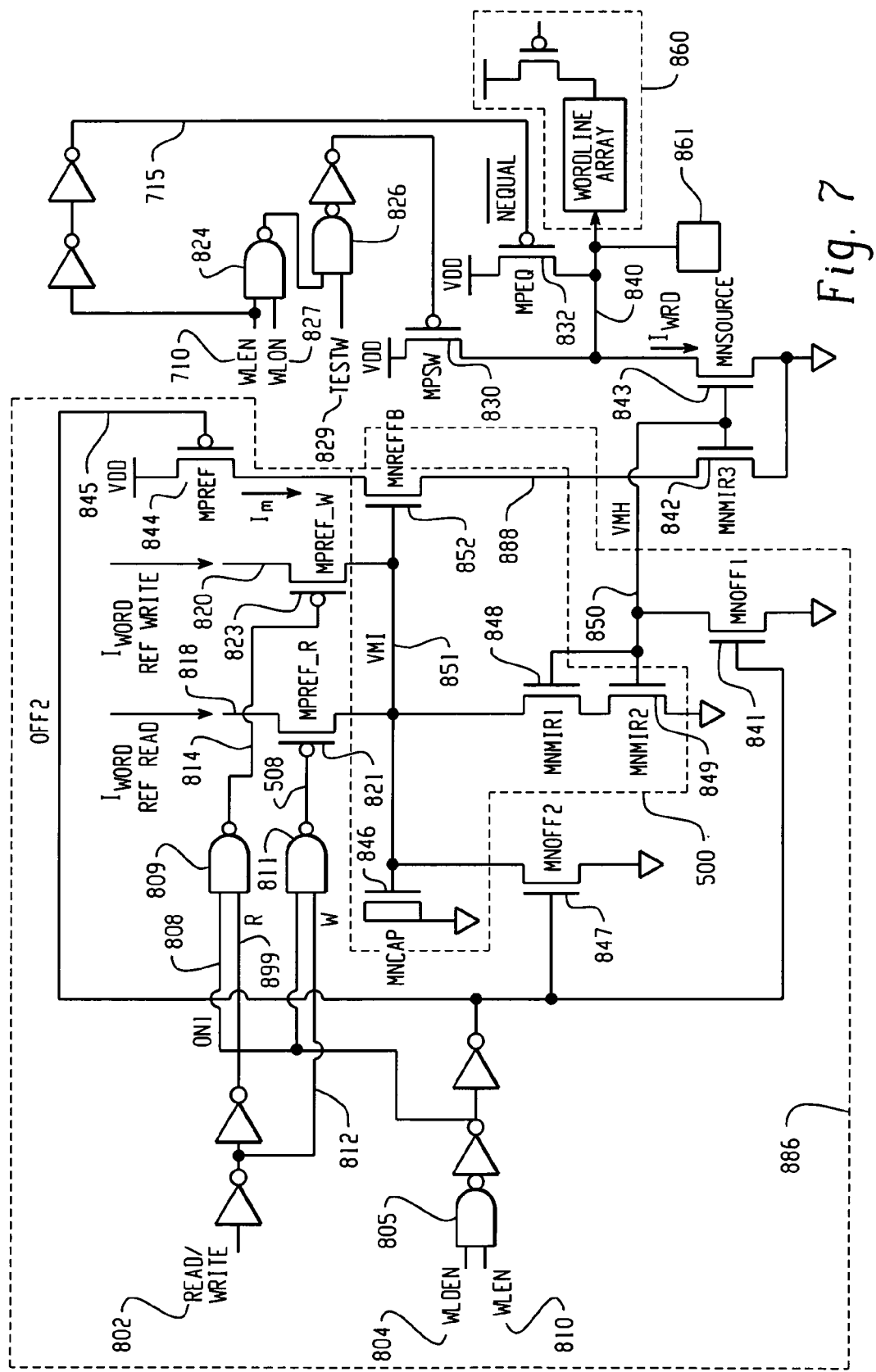
FIG. 7 shows a circuit schematic diagram of a current driver according to the preferred teachings of the present invention.

Refer now also to FIGS. 6 and 7 which show a word driver circuit for an MRAM 10 according to the preferred teachings of the present invention. A read reference current 818 ranges from 50–150 microamps, and preferably by 100 microamps, and a write reference current 820 ranging from 100–300 microamps, preferably 200 microamps, is provided to a stabilization and control block 886. Depending on the reference current selected, either the I ref write reference current 820 or the I ref read reference current 818 will be driven on the I ref 851 signal line. An on/off signal 810 and 804, implemented as a double enable, and a read/write signal 802 provide control signals to the stabilization and control block 886.

Refer now to drawing 7 that shows the word drive circuitry with its associated controls and features. A write signal 802 is buffered and provided to nand 809. The inverted version of write signal 802 is signal 812 and signal 812 is provided to nand 811. A word line enable signal 810 and word line direction enable signal 804 are provided to nand 805. The word line direction enable signal 804 indicates what direction, either a read direction or write direction, a word line current Iwrd 840 is driven. The output of nand 805 is inverted and provided to nand 809 as On1 signal 808. The On1 signal 808 is provided to a nand 811 also. Nand 809 provides the enable signal 814 to the gate of P-channel transistor 823. Transistor 823 enables word reference write current 820 input and provides the VMI signal 851 when enabled.

The On1 signal 808 is inverted to generate the OFF2 signal 845. Nand 811 controls the gate of P-channel transistor 821. Transistor 821 enables word reference read current 818 input and provides the VMI signal 851 when enabled.

Capacitor 846 is connected to the VMI signal as well as the MN off2 transistor 847. The gate of MN off2 transistor 847 is controlled by the Off2 signal 845. The Off2 signal 845 also controls the gate of the MPREF transistor 844.

The VMI signal is connected to control the gate of MNREFB 852. MNREFB 852 is connected to the MPREF transistor 844 and the MNMIR3 transistor 842. The MNMIR3 842 transistor is connected in a mirror configuration to MNSOURCE transistor 843. The MNMIR1 transistor 848 is connected to the VMI signal and its gate is controlled by the VMH signal 850. The MNMIR2 transistor 849 is connected to the MNMIR2 848 transistor and is gate controlled by the VMH signal 850 as well.

The MPEQ transistor 832 is gate controlled by the NEQUAL' signal 720. The MPEQ transistor 832 drives the word line array through the word line current Iwrd 840 connection. The MNSOURCE transistor 843 also drives the word line current Iwrd 840. The NEQUAL' signal 720 is generated by a double inverted drive combination from the WLEN word line enable signal 710. This is configured for the P-channel MPEQ transistor 832. The control for the MPSW switch transistor 830 takes into account the enable circuitry, and signals WLEN 710 and WLON 827 as well as the disable function provided by TestW 829 and its circuitry. The output of nor 826 is inverted and provided to the gate of the MPSW switch transistor 830. Nor 826 nors the TESTW signal 829 with the output of the nanding 824 of the WLEN signal 710 and the word line on control signal WLON 827.

The control of p-channel transistor MPSW 830 includes the TestW 829 and WLON 827 options. They allow for on and off control of p-channel transistor MPSW 830 independent of the control of the n-channel transistor MNSOURCE 843 and its controlling circuitry. The controlling circuitry of the n-channel transistor MNSOURCE 843 is shown in FIG. 7.

The independent WLON 827 control signal to nand 824 allows the p-channel transistor 830 to be turned on or off at a different time than n-channel transistor 843. With this feature the p-channel transistor MPSW 830 could be turned on prior to the n-channel transistor MNSOURCE 843. When this is done, current surges from switching can be reduced or regulated because switching is then controlled by the n-channel transistor MNSOURCE 843.

The TestW 829 signal that controls the nor 826 is the feature that allows an independent disable of p-channel transistor 830. This is independent of the normal function of the MRAM 10. During normal operation, the TestW 829 signal is held low and is disabled. When the TestW 829 is forced high to VDD, the function of p-channel transistor MPSW 830 can be supplied by an external connection or pad 861 connected to the word line current Iwrd 840. By observing the current or voltage on this external connection, the actual word line current Iwrd 840 can be measured and observed for magnitude and overshoot conditions.

The stabilization and control block 886 provides a central current signal 888 to the mirror input n-channel transistor 842. The stabilization and control block 886 accepts a feed back voltage 850. The stabilization and control block 886 dampens the effect of the change in the feed back voltage 850. The gates of the mirror output n-channel MNSOURCE transistor 843 and the mirror input n-channel MNMIR3 transistor 842 are connected. The mirror output n-channel transistor MNSOURCE 843 supplies the word line current I wrd 840.

The R/W signal 802 and on/off signals 810 and 804 are provided to a logic control block 504 that provides a gate control signal 814 to P-channel write transistor 823 and a gate control signal 508 to P-channel read transistor 821. The logic control block 504 implements the following truth table in a well-known manner using boolean logic:

| R/W | On/Off | PW | PR |
|-----|--------|-----|-----|
| On  | On     | Off | On  |
| Off | On     | On  | Off |
| On  | Off    | Off | Off |
| Off | Off    | Off | Off | where On is VDD and Off is VSS when applied to the gates of transistors 823 and 821.

One of the inputs to the word driver stabilization amplifier is the reference current I ref 851 that flows through transistor 848 and transistor 849 creating a voltage that controls transistor MNREFFB 852. The current through transistor 852 is the input to the MNMIR3 mirror transistor 842 that gets multiplied through MNSOURCE transistor 843 to become the word line current Iwrd 840. The current through MNSOURCE transistor 843 is dampened from overshoot by the interaction of the voltage on signal line 850 through an increasing voltage on signal line 850 that increases the conductance of MNMIR2 transistor 849 and MNMIR1 transistor 848 that reduces the voltage level of signal 851, that in turn reduces the conductance of MNREFFB transistor 852. This decreases the mirror reference current Im 888 into the mirror input MNMIR3 transistor 842 that reduces the overshoot in the word line current Iwrd 840 that in turn reduces the word current Iwrd 840 in MNSOURCE transistor 843.

The capacitor 846 reduces the rate of change of the voltage signal 851 and stabilizes the dampening process in the feedback loop between MNMIR7 transistor 848, MNMIR2 transistor 849, MNREFFB transistor 852, MNMIR3 transistor 842 and MNSOURCE transistor 843.

Functionally, any one or none of the reference signals, write reference current 820 or read reference current 818 will drive the current input signal 851 to a stabilization amplifier 500 implemented as a current amplifier. For example, with an on R/W signal 802 in the on state and an on/off signal 810 in the on state, the current or the current input signal originates from the P-channel transistor 821, providing a read reference current to the stabilization amplifier 500.

The word line current Iwrd 840 of the n-channel drive supply transistor 843 will range in a read mode between 10–25 milliamps and preferably about 20 milliamps, and in a write mode between 30 and 50 milliamps and preferably about 40 milliamps. Those skilled in the art will appreciate that the optimum operating current will vary depending on specific technology used to implement the transistors used.

In one embodiment, the MRAM circuitry 860 may include any useful MRAM memory circuit, as for example, a word line or a bit line. The n-channel transistor 843 may preferably be a CMOS n-channel field effect transistor. The activation signal may preferably comprise a voltage level of at least a logic "1" in order to turn on the n-channel transistor. Voltage levels between logic "1" and logic "0" may be used to control current flow through the n-channel transistor.

According to the preferred teachings of the present invention, regulated transistors driving the word lines are system implemented as n-channel and the regulated transistors driving the sense lines are implemented as p-channels. Those skilled in the art will recognize that this configuration has the advantage that noise on the word line drivers is electrically isolated from the sense line transistors.

The invention has been described herein in considerable detail in order to comply with the Patent Statutes and to provide those skilled in the art with the information needed to apply the novel principles of the present invention, and to construct and use such exemplary and specialized components as are required. However, it is to be understood that the invention may be carried out by specifically different equipment and devices, and that various modifications, both as to the equipment details and operating procedures, may be accomplished without departing from the true spirit and scope of the present invention.

The invention claimed is:

1. A word current source for a magnetoresistive random access memory circuit comprising, in combination:
   a control circuit having a control input;
   an n-channel transistor including a gate, a source and a drain, where the source is coupled to a supply ground, the drain is coupled to the magnetoresistive random access memory circuit and the gate is connected to the control input; and
   a positive supply voltage coupled to the magnetoresistive random access memory circuit so as to allow current to flow through the magnetoresistive random access memory circuit when an activation signal is applied to the gate by the control circuit;
   wherein the control circuit comprises a voltage regulator that regulates a voltage level at the gate, so as to limit an amount of current flowing through the n-channel transistor and the magnetoresistive random access memory circuit.

2. The word current source of claim 1 with the voltage regulator comprising a feed back amplifier.

3. The word current source of claim 1 with the voltage regulator being current controlled.

4. The word current source of claim 1 with the n-channel transistor comprising a complementary metal oxide semiconductor n-channel field effect transistor.

5. The word current source of claim 4 wherein the control circuit comprises a current regulator that regulates current flowing through the complementary metal oxide semiconductor (CMOS) n-channel field effect transistor when the CMOS n-channel field effect transistor is turned on and off.

6. The word current source of claim 5 with the current regulator comprising a feed-back amplifier.

7. A word current source for a magnetoresistive random access memory circuit comprising, in combination:
   a control circuit having a control input;
   an n-channel transistor including a gate, a source and a drain, where the source is coupled to a supply ground, the drain is coupled to the magnetoresistive random access memory circuit and the gate is connected to the control input; and
   a positive supply voltage coupled to the magnetoresistive random access memory circuit so as to allow current to flow through the magnetoresistive random access memory circuit when an activation signal is applied to the gate by the control circuit;
   wherein the control circuit comprising a stabilization amplifier, comprising:
      a logic control having a read/write input and an on/off input and a write reference gate control signal and a read reference gate control signal;
      a read reference switch having a read reference input and a reference output, with the read reference switch having a read reference control connected to the read reference gate control signal;
      a write reference switch having a write reference input and a write reference output connected to the reference output, with the write reference switch having a write reference control connected to the write reference gate control signal; and
      a feedback amplifier connected to the reference output, having a mirror current output and a mirror feedback voltage input.

8. A word current source for a magnetoresistive random access memory circuit comprising, in combination:
   a control circuit having a regulated mirror gate signal;
      a complementary metal oxide semiconductor (CMOS) n-channel transistor including a gate, a source and a drain, where the source is coupled to a supply ground, and the drain is coupled to the magnetoresistive random access memory circuit; and
      a positive supply voltage coupled to the magnetoresistive random access memory circuit so as to allow current to flow through the magnetoresistive random access memory circuit when an activation signal is applied to the gate by the control circuit, wherein the control circuit comprises means for regulating a voltage level at the gate, so as to limit the amount of current flowing through the CMOS n-channel transistor and the magnetoresistive random access memory circuit.

9. The word current source of claim 8 wherein the means for regulating the voltage level comprises a feed back amplifier.

10. The word current source of claim 8 wherein the control circuit comprises means for regulating a current flowing through the CMOS n-channel transistor when the CMOS n-channel transistor is turned on and off.

11. The word current source of claim 8 with the control circuit further comprising a stabilization amplifier.

12. The word current source of claim 11 with the stabilization amplifier further comprising, in combination:
   a logic control having a read/write input and an on/off input and a write reference gate control signal and a read reference gate control signal;
   a read reference switch having a read reference input and a reference output, with the read reference switch having a read reference control connected to the read reference gate control signal;
   a write reference switch having a write reference input and a write reference output connected to the reference output, with the write reference switch having a write reference control connected to the write reference gate control signal; and
   a feedback amplifier connected to the reference output, having a mirror current output and a mirror feedback voltage input.

13. A word current source for a magnetoresistive random access memory circuit comprising, in combination:
   a control circuit having a control input;
   a n-channel semiconductor device including a first terminal, a second terminal and a third terminal, where the first terminal is coupled to a supply ground, and the second terminal is coupled to the magnetoresistive random access memory circuit; and
   a positive supply voltage, coupled to the magnetoresistive random access memory circuit so as to allow current to flow through the magnetoresistive random access memory circuit when an activation signal is applied to the third terminal by the control circuit;
   wherein the control circuit comprises means for regulating a voltage level at the third terminal, so as to limit the amount of current flowing through the n-channel semiconductor device and the magnetoresistive random access memory circuit.

14. The word current source of claim 13 wherein the means for regulating the voltage comprises a feed back circuit.

* * * * *